United States Patent [19]
Mackenzie

[11] Patent Number: 5,969,920
[45] Date of Patent: Oct. 19, 1999

[54] TEST CIRCUIT FOR VERIFYING OPERATION OF AN ARC FAULT DETECTOR

[75] Inventor: Raymond Warren Mackenzie, Baldwin Borough, Pa.

[73] Assignee: Eaton Corporation, Cleveland, Ohio

[21] Appl. No.: 09/049,318

[22] Filed: Mar. 27, 1998

[51] Int. Cl.⁶ .................................................. H02H 3/00
[52] U.S. Cl. ............................................ 361/42; 324/520
[58] Field of Search ................................. 361/42, 44–50, 361/79, 87, 93, 94, 99; 324/76.42, 76.43, 76.44, 76.45, 520–523, 541, 544; 702/FOR 104, FOR 106, FOR 107, FOR 109

[56] References Cited

U.S. PATENT DOCUMENTS

| | | | |
|---|---|---|---|
| 5,224,006 | 6/1993 | MacKenzie et al. | 361/45 |
| 5,280,404 | 1/1994 | Ragsdale | 361/113 |
| 5,307,230 | 4/1994 | MacKenzie | 361/96 |
| 5,459,630 | 10/1995 | MacKenzie et al. | 361/45 |
| 5,519,561 | 5/1996 | Mrenna et al. | 361/105 |
| 5,682,101 | 10/1997 | Brooks et al. | 324/536 |
| 5,691,869 | 11/1997 | Engel et al. | 361/42 |

*Primary Examiner*—Ronald W. Leja
*Attorney, Agent, or Firm*—Martin J. Moran

[57] ABSTRACT

A test circuit for arc fault detectors of the type which respond to step changes in ac current over time generated each time an arc is struck includes a low frequency relaxation oscillator which generates a repetitive signal with step changes like those produced by an arc fault. The relaxation oscillator includes a capacitor charged through a resistor and shunted by a voltage breakdown device, preferably a diac. The capacitor is rapidly discharged when its voltage reaches the breakdown voltage of the voltage breakdown device to generate the step change which is input to the arc fault detector. With a repetition rate of the relaxation oscillator not greater than about 15 repetitions per second (rps), and preferably about 5 rps, a user can manually determine the time to trip to verify arc fault detector operation. With the oscillator operating at such a low frequency, a signaling device such as a light emitting diode (LED) placed in series with the voltage breakdown device, permits the user to manually count the number of step changes required to produce a trip thereby providing further verification of detector operability.

16 Claims, 1 Drawing Sheet

TEST CIRCUIT FOR VERIFYING OPERATION OF AN ARC FAULT DETECTOR

BACKGROUND OF THE INVENTION

1. Field of the Invention

This invention relates to testing arc fault detectors including those used in circuit breakers. Specifically, it is directed to an arc fault detector test circuit which employs a low frequency relaxation oscillator for simple verification of the operability of the detector.

2. Background Information

Arc faults can occur in electrical systems, for instance, between adjacent bared conductors, between exposed ends of broken conductors, a faulty connection, and in other situations where conducting elements are in close proximity. Arc faults typically have high resistance so the arc current is below the instantaneous or magnetic trip thresholds of conventional circuit breakers. Also, arc faults create an average RMS current value which is below the thermal threshold for such circuit breakers. Even so, the arcs can cause damage or start a fire if they occur near combustible material. It is not practical to simply lower the pick-up currents on conventional circuit breakers, as there are many typical loads which draw similar currents, and would therefor, cause nuisance trips.

Thus, various types of arc fault detectors have been proposed. Some of these detectors respond to the step change in current randomly occurring each time an arc is struck. One such detector is disclosed in U.S. Pat. No. 5,459,630. This detector counts the number of step changes in current which occur in a given time interval. U.S. Pat. No. 5,459,630 also discloses a test circuit for testing the arc fault detector. The particular circuit disclosed utilizes one of the coils of the dormant oscillator ground fault circuit also provided in the circuit breaker. A capacitor forms with the sensing coil an oscillator when a test button is closed. Another test circuit suggested by U.S. Patent No. 5,459,630 includes an impedance, such as a resistor, which is connected across the line and neutral conductors to produce a pulse each time a test switch is closed. This test circuit requires repeated manual actuation of the test switch to generate test pulses which are then counted by the arc fault detector.

An improved arc fault detector of the type which responds to the step changes in current produced by the striking of the arc, is described in U.S. Pat. No. 5,691,869. An arc fault signal which can be used to trip a circuit breaker is generated when a time attenuated accumulation of the pulses generated each time an arc is struck reaches a selected magnitude. Thus, fewer arcs which produce large step increases in current are required to trip the circuit breaker than smaller amplitude arcs.

While test circuits such as those described in U.S. Pat. No. 5,459,630 could be applied to the arc fault detectors of U.S. Pat. No. 5,691,869, there is a need for improved arc fault test circuits.

More particularly, there is a need for an improved test circuit for an arc fault detector which automatically generates step increases mimicing the striking of an arc, and therefore, does not require repetitive actuation to generate a series of "simulated" arcs.

There is a more particular need for such an arc fault detector test circuit which provides more information about the operation of the test circuit.

In particular, there is a need for such a test circuit which provides an indication of the number of simulated arc strikes which generated the trip.

There is a further need for such a test circuit which alternatively, or additionally, allows an operator to manually time the time to trip using the test circuit.

SUMMARY OF THE INVENTION

These needs and others are satisfied by the invention which is directed to the test circuit for an arc fault detector which responds to step increases in an alternating current caused by an arc fault over a period of time. The test circuit includes a relaxation oscillator for generating a pulse signal having a repetition rate of no more than about 15 pulses per second, and coupling means applying the pulse signal to the arc fault detector. Preferably, power for the relaxation oscillator is provided by the ac current through a rectifier.

Preferably, the relaxation oscillator comprises a capacitor, a resistor through which dc current from the electrifier is applied to the capacitor, and a voltage break down device shunting the capacitor. With a test switch closed, the capacitor is charged to the break down voltage of the voltage breakdown device. The capacitor is then rapidly discharged through the voltage break down device thereby generating a pulse which simulates the striking of an arc. A preferred voltage break down device is a diac; however, other voltage break down devices such as a neon bulb, a silicon bilateral switch, a unijunction transistor and the like could be used. Where the arc fault detector only responds to step changes in the ac current over at least a minimum amplitude, the coupling means preferably couples the pulse signal from the test circuit into the arc fault detector at about this minimum amplitude. This verifies the response of the arc fault detector to low current arcs.

By using a low frequency relaxation oscillator, the user is able to manually determine the time to trip. With the pulse repetition rate of the relaxation oscillator set to a known value, proper operation of the arc fault detector can be determined by generation of the trip signal within a predetermined period of time. In accordance with another aspect of the invention, an indicator is provided in the relaxation oscillator to provide an indication each time a test pulse is generated. Preferably, a light emitting diode (LED) is connected in series with the voltage break down device so that a pulse of light is generated each time the device breaks down to generate an electrical pulse. Again, since the frequency of the relaxation operator is low, a user is able to count the number of pulses required to generate a trip.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

The invention will be described as applied to an arc fault detector which is incorporated into a circuit breaker. However, it will be appreciated that the test circuit of the invention is applicable to arc fault detectors in general of the type which respond to the step changes in current caused by the repetitive random striking of an arc.

Figure 1:
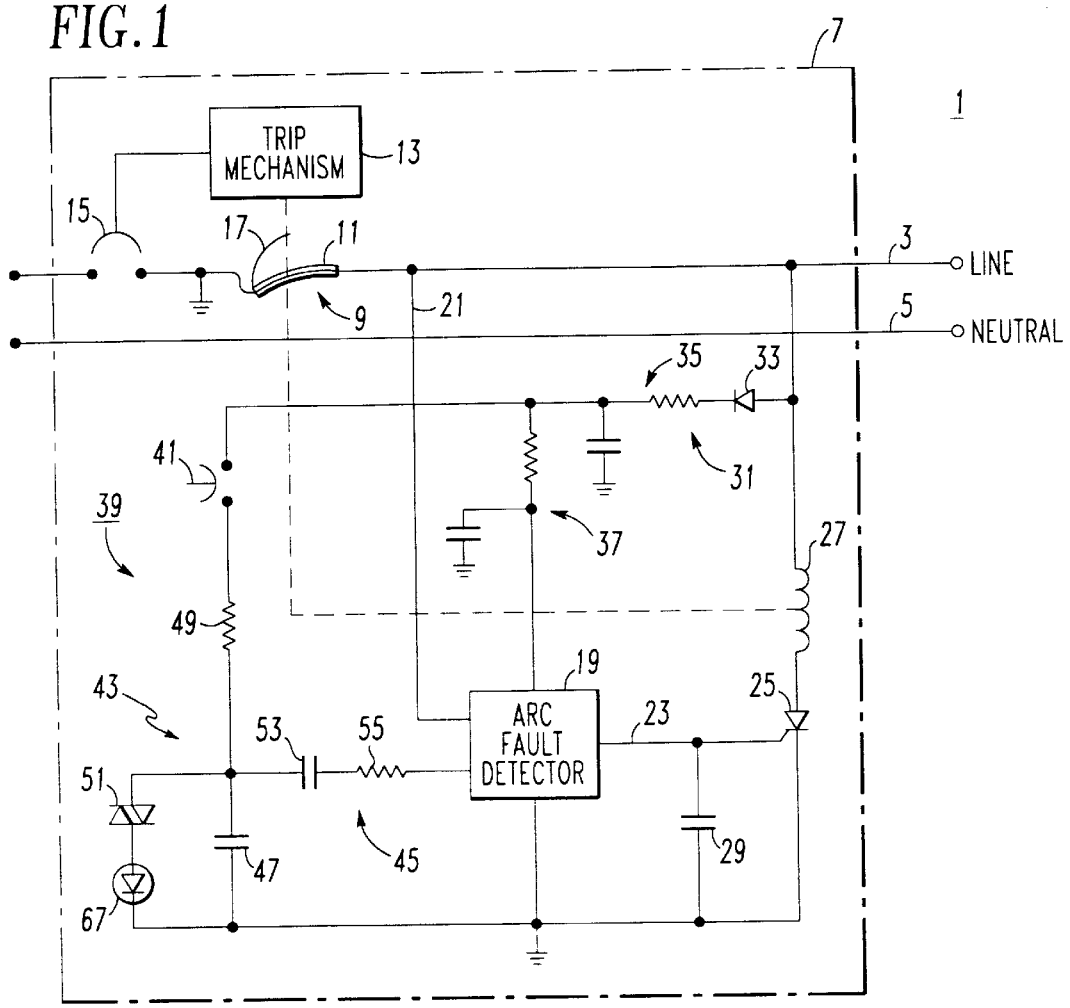
FIG. 1 is a schematic diagram of a circuit breaker incorporating an arc fault detector and a test circuit for the arc fault detector in accordance with the invention.

Referring to FIG. 1, an electrical distribution system 1 having a line conductor 3 and a load conductor 5 is protected by a circuit breaker 7. The exemplary circuit breaker 7 is the well-known "miniature" type circuit breaker commonly used in residential and light commercial applications. Such a circuit breaker 7 has a thermal magnetic trip device 9 which includes a bimetal 11 connected in series in the line conductor 3. Persistent overcurrents in the electrical system 1 heat up the bimetal 11 causing it to deflect and actuate a trip mechanism 13 which opens separable contacts 15 to interrupt current flow in the electrical system 1. In addition, thermal magnetic trip device 9 includes a magnetic trip function. An armature 17 is deflected by very large overcurrents such as those associated with a short circuit to actuate the trip mechanism 13 and open the separable contacts 15.

The circuit breaker 7 also provides protection against arc faults. Such faults are typically characterized by repetitive intermittent striking of an arc. The circuit breaker 7 includes an arc fault detector 19 which responds to the step changes in the ac current produced each time the arc is struck. Suitable arc fault detectors are disclosed, for instance, in U.S. Pat. No. 5,224,006, with a preferred type described in U.S. Pat. No. 5,691,869 which is hereby incorporated by reference. The arc fault detector 19 senses the current in the electrical system 1 by monitoring the voltage across the bimetal 11 through the lead 21 in the manner described in U.S. Pat. No. 5,519,461. As the impedance of the bimetal 11 is known, the voltage drop across the bimetal provides a representation of line current.

As described in U.S. Pat. No. 5,691,869, the arc fault detector 19 includes circuitry which generates a pulse in response to each step change in current. The pulse signal is integrated with the integration attenuated over time. When the time attenuated accumulation of the pulses reaches a selected level, the arc fault detector 19 generates a trip signal. This trip signal output on the lead 23, triggers a silicon control rectifier (SCR) 25. Turn on of the SCR 25 energizes a trip coil 27 which releases the trip mechanism 13 to open the separable contacts 15. The capacitor 29 protects the SCR 25 from false turn on due to transients on the gate electrode. Power for the arc fault detector 19 is provided by a dc power source 31 energized by the electrical system 1. The dc power source 31 includes a diode 33 which provides halfwave rectified power which is filtered by a first low pass filter 35 and a second low pass filter 37 which removes much of the 60 cycle ripple. The arc fault detector 19 includes a voltage regulator (not shown) which provides the required dc voltages to the arc fault detector 19.

A test circuit 39 automatically generates a test signal for testing operation of the arc fault detector 19 when a test button 41 is actuated. The test circuit 39 includes a low frequency relaxation oscillator 43 and a coupling circuit 45 for coupling the pulse signal generated by the relaxation oscillator 43 to the arc fault detector 19. The relaxation oscillator 43 includes a capacitor 47 which is charged through a resistor 49 when the test button 41 is closed. The capacitor 47 is shunted by a voltage break down device 51. The preferred device 51 is a diac; however, other voltage break down devices such as a neon bulb, a silicon bilateral switch, a unijunction transistor and the like could be used. The power source 31 also provides power for the relaxation oscillator 43, although dc power filtered only by the first low pass filter 35 is used so that sufficient voltage for operation of the relaxation oscillator 43 is provided.

With the test button 41 closed, the capacitor 47 charges at a rate determined by the time constant established by the values of the capacitor 47 and the charging resistor 49. When the voltage across the capacitor 47 reaches the break down voltage of the diac 51, the diac conducts to rapidly discharge the capacitor 47 thereby providing a step change in the voltage across the capacitor 47. Thus, the waveform generated by the relaxation oscillator mimics the step changes in current caused by an arc in the electrical system 1.

Figure 2:
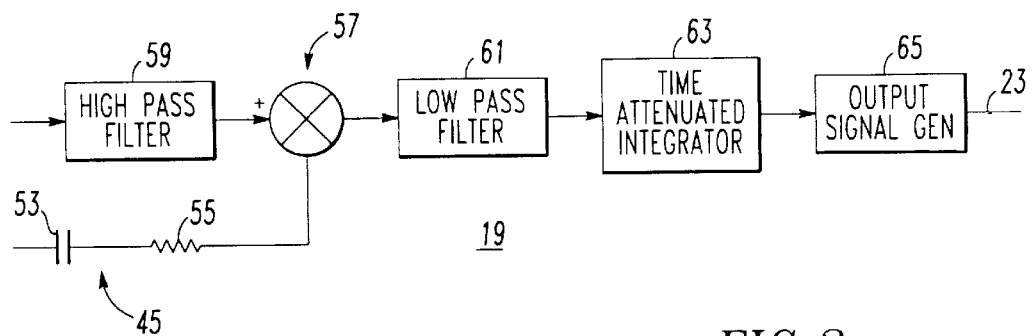
FIG. 2 is a schematic diagram in block form of the arc fault detector which forms part of FIG. 1.

The output of the relaxation oscillator is applied to the arc fault detector 19 through the coupling circuit 45. This coupling circuit 45 includes a series capacitor 53 and resistor 55. As will be seen from FIG. 2, the arc fault detector 19 has a bandpass filter at its input which generates a pulse signal in response to the step changes in current such as are generated by the striking of an arc. The bandpass filter 57 includes a high pass filter 59 followed by a low pass filter 61. Because of the very low resistance of the bimetal, the output of the relaxation oscillator 43 cannot be injected through the same input as the lead 21 since it does not have sufficient power. Thus, the test signal is injected into the arc fault detector 19 after the high pass filter 59. The capacitor 53 and resistor 55 of the coupling circuit 45 form the high pass filter section of a bandpass filter for the output signal of the relaxation oscillator. The output of the low pass filter 61 is a pulse signal generated in response to the step change in current produced by the striking of an arc or by the relaxation oscillator. These pulses are integrated with the integrated value attenuated over time in a time attenuated integrator 63. When the value of the time attenuated integration equals a selected level, an output signal generator 65 generates the trip signal which turns on the SCR 25. The trip level of the time attenuated integration of pulses is reached sooner for larger amplitude and for more rapidly occurring step changes. However, the step changes must have at least a minimum amplitude in order to be included in the integration. The values of the capacitor 53 and 55 are therefore also selected to produce pulses which are above but near the minimum level in order to assure that the arc fault detector is responding properly to smaller amplitude arcs.

As mentioned, the relaxation oscillator 43 is designed to operate at a low frequency. By low frequency is meant a frequency which requires a humanly perceptible amount of time for the trip signal to be generated, for instance, one to a few seconds. Thus, as the relaxation oscillator will operate at a selected frequency, and as long as the voltage in the electrical system remains relatively constant, the time required for the trip signal to be generated after the test button is depressed is a measure of the performance of the arc fault detector 19.

As a further aid in verifying the operation of the arc fault detector 19, a signal generator 67 can be connected in series with the diac 51. In the preferred embodiment, the signal generator 67 is a light-emitting diode (LED) which provides a visual indication to the user each time the relaxation oscillator 43 generates a step change which is applied to the arc fault detector 19. Thus, the pulse repetition rate of the relaxation oscillator 53 should be selected such that a human user can count the step changes as they are generated. For this purpose, the pulse repetition rate of the relaxation oscillator should be no more than about 15 cycles per second and preferably about 5 cycles per second. This feature enables the user to further analyze the operation of the arc fault detector by providing an indication of the number of step changes as well as the time required to generate a trip signal. As can be seen, the arc fault detector test circuit of the invention provides a simple, inexpensive arrangement for testing the operation of arc fault detectors of the type which respond to step changes in current generated by the striking of an arc.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breath of the claims appended and any and all equivalents thereof.

What is claimed is:

1. A test circuit for testing an arc fault detector which responds to a plurality of step increases in an alternating current in an ac power system caused by an arc fault over a period of time, said test circuit comprising:

a power source;

a relaxation oscillator powered by said power source for generating a repetitive signal having step changes, said signal having a selected repetition rate of not more than about 15 per second; and coupling means coupling said repetitive signal to said arc fault detector.

2. The test circuit of claim 1 wherein said relaxation oscillator comprises a capacitor, a resistor through which said capacitor is charged by said power source, and a voltage breakdown device shunting said capacitor, the values of said resistor and capacitor, and a breakdown voltage of said voltage breakdown device being selected to provide said selected repetition rate.

3. The test circuit of claim 2 wherein said power source comprises rectifier means connected to said ac power system.

4. The test circuit of claim 2 wherein said coupling means comprises circuit means applying voltage across said capacitor to said arc fault detector.

5. The test circuit of claim 4 adapted for use with an arc fault detector which responds only to step changes in said ac current having at least a minimum amplitude, wherein said circuit means comprises components applying said repetitive signal to said arc fault detector at about said minimum amplitude.

6. The test circuit of claim 4 wherein said circuit means comprise a series resistor and capacitor.

7. The test circuit of claim 6 wherein said voltage break down device is a diac.

8. The test circuit of claim 7 wherein said power source comprises rectifier means connected to said ac power system.

9. The test circuit of claim 5 including a signaling device in series with said voltage break down device.

10. The test circuit of claim 9 wherein said signaling device comprises a light emitting diode.

11. The test circuit of claim 2 including a signaling device in series with said voltage break down device.

12. The test circuit of claim 11 wherein said signaling device comprises a light emitting diode.

13. The test circuit of claim 12 wherein said voltage break down device comprises a diac.

14. The test circuit of claim 1 wherein said relaxation oscillator includes a signaling device identifying each step change in said repetitive signal.

15. The test circuit of claim 14 wherein said signaling device is a light emitting diode.

16. The test circuit of claim 1 wherein said relaxation oscillator generates a repetitive signal with a repetition rate between about 15 per second and about 1 per second.

* * * * *